| United States Patent [19] | [11] Patent Number: 4,904,561 |
|---|---|
| Yamamoto | [45] Date of Patent: Feb. 27, 1990 |

[54] LIGHT-SENSITIVE MATERIAL CONTAINING SILVER HALIDE, REDUCING AGENT AND POLYMERIZABLE COMPOUND WHEREIN THE MATERIAL IS SENSITIVE FROM ONLY 600 NM TO 950 NM

[75] Inventor: Soichiro Yamamoto, Kanagawa, Japan

[73] Assignee: Fuji Photo Film Co., Ltd., Kanagawa, Japan

[21] Appl. No.: 122,808

[22] Filed: Nov. 19, 1987

[30] Foreign Application Priority Data

Nov. 19, 1986 [JP] Japan .................................. 61-277092

[51] Int. Cl.⁴ .......................... G03C 1/72; G03C 1/08
[52] U.S. Cl. .................................... 430/138; 430/944; 430/945
[58] Field of Search .................... 430/138, 944, 945

[56] References Cited

U.S. PATENT DOCUMENTS

| 3,443,948 | 5/1969 | Bryan | 430/138 |
|---|---|---|---|
| 3,694,252 | 9/1972 | Gerber et al. | 430/138 |
| 3,694,253 | 9/1972 | Gerber et al. | 430/138 |
| 4,617,257 | 10/1986 | Sawada et al. | 430/560 |
| 4,619,892 | 10/1986 | Simpson et al. | 430/944 |
| 4,624,910 | 11/1986 | Takeda | 430/203 |
| 4,629,676 | 12/1986 | Hayakawa et al. | 430/203 |
| 4,637,975 | 1/1987 | Kabodera et al. | 430/353 |
| 4,649,098 | 3/1987 | Takeda | 430/270 |
| 4,775,656 | 10/1988 | Harada et al. | 430/138 |

Primary Examiner—Paul R. Michl
Assistant Examiner—Patrick A. Doody
Attorney, Agent, or Firm—Sughrue, Mion, Zinn, Macpeak & Seas

[57] ABSTRACT

A light-sensitive material comprises a light-sensitive layer which contains silver halide, a reducing agent, a polymerizable compound and a color image forming substance provided on a support. The silver halide, polymerizable compound and color image forming substance are contained in microcapsules to form light-sensitive microcapsules which are dispersed in the light-sensitive layer. These light-sensitive microcapsules have spectral sensitivity peaks within the wavelength region of 600 nm to 950 nm and composed of at least two kinds of light-sensitive microcapsules differing from each other with respect to spectral sensitivity.

6 Claims, No Drawings

LIGHT-SENSITIVE MATERIAL CONTAINING SILVER HALIDE, REDUCING AGENT AND POLYMERIZABLE COMPOUND WHEREIN THE MATERIAL IS SENSITIVE FROM ONLY 600 NM TO 950 NM

BACKGROUND OF THE INVENTION

1. Field of the invention

This invention relates to a light-sensitive material comprising a light-sensitive layer which contains silver halide, a reducing agent, a polymerizable compound and a color image forming substance provided on a support.

2. Description of prior art

Light-sensitive materials comprising a light-sensitive layer containing silver halide, a reducing agent and a polymerizable compound provided on a support can be used in an image forming method in which a latent image of silver halide is formed, and then the polymerizable compound is polymerized to form the corresponding image.

Examples of said image forming methods are described in Japanese Patent Publication Nos. 45(1970)-11149 (corresponding to U.S. Pat. No. 3,697,275), 47(1972)-20741(corresponding to U.S. Pat. No. 3,687,667) and 49(1974) -10697, and Japanese Patent Provisional Publication Nos. 57(1982)-138632, 57(1982)-142638, 57(1982)-176033, 57(1982)-211146 (corresponding to U.S. Pat. No. 4,557,997), 58(1983)-107529 (corresponding to U.S. Pat. No. 4,560,637), 58(1983)-121031 (corresponding to U.S. Pat. No. 4,547,450) and 58(1983)-169143. In these image forming methods, when the exposed silver halide is developed using a developing solution, the polymerizable compound is induced to polymerize in the presence of a reducing agent (which is oxidized) to form a polymer image. Thus, these methods need a wet development process employing a developing solution. Therefore, the process takes a relatively long time for the operation.

An improved image forming method employing a dry process is described in Japanese Patent Provisional Publication Nos. 61(1986)-69062 and 61(1986)-73145 (the contents of both publications are described in U.S. Pat. No. 4,629,676 and European Patent Provisional Publication No. 0174634A2). In this image forming method, a recording material (i.e., light-sensitive material) comprising a light-sensitive layer containing a light-sensitive silver salt (i.e., silver halide), a reducing agent, a cross-linkable compound (i.e., polymerizable compound) and a binder provided on a support is imagewise exposed to form a latent image, and then the material is heated to polymerize within the area where the latent image of the silver halide has been formed. The above method employing the dry process and the light-sensitive material employable for such method are also described in Japanese Patent Provisional Publication Nos. 61(1986)-183640, 61(1986)-188535 and 61(1986)-228441.

The above-mentioned image forming methods are based on the principle in which the polymerizable compound is polymerized within the area where a latent image of the silver halide has been formed.

Further, Japanese Patent Provisional Publication No. 61(1986)-260241 describes another image forming method in which the polymerizable compound within the area where a latent image of the silver halide has not been formed is polymerized. In this method, when the material is heated, the reducing agent functions as polymerization inhibitor within the area where a latent image of the silver halide has been formed, and the polymerizable compound within the other area is polymerized.

In the light-sensitive materials which are used for the above-mentioned image forming methods, a color image forming substance can be contained in the light-sensitive layer of the material to form a color image. The light-sensitive material containing the color image forming substance is described in Japanese Patent Provisional Publication No. 61(1986)-73145.

Further, the silver halide, the polymerizable compound and the color image forming substance can be contained in microcapsules which are dispersed in the light-sensitive layer. The light-sensitive material employing microcapsules is described in Japanese Patent Provisional Publication No. 61(1986)-275742. The light-sensitive material containing such microcapsules has an advantage in that an image improved in the sharpness can be obtained.

SUMMARY OF THE INVENTION

The present inventor found that a light-sensitive material employing at least two kinds of light-sensitive microcapsules is easy to adjust or control gradation of the obtained image and that the light-sensitive material can advantageously give a multicolor image or a full color image (Japanese Patent Provisional Publication No. 62(1987)-198850). The two kinds of microcapsules usually differ from each other with respect to the spectral sensitivity.

According to further study of the present inventor, in the case that the light-sensitive material employs at least two kinds of light-sensitive microcapsules differing from each other with respect to spectral sensitivity is employed, it has been discovered that a laser beam is favorably used as a light source in the image forming process because the laser beam corresponding to each kind of the microcapsules in the spectral sensitivity is easily chosen, since it is highly monochromatic. As the laser beam, there can be mentioned a gas laser (e.g., argon laser, helium-cadmium laser), a solid laser (e.g., YAG laser, glass laser) and a semiconductor laser. The laser beam has another advantage of high energy.

An object of the present invention is to provide a light-sensitive material employing at least two kinds of microcapsules which gives an improved clear image.

Another object of the invention is to provide a light-sensitive material which is readily and favorably employable in an image forming process utilizing a laser beam as the light source.

A further object of the invention is to provide a light-sensitive material which is advantageously used for printing out detailed information.

There is provided by the present invention a light-sensitive material comprising a light-sensitive layer which contains silver halide, a reducing agent, a polymerizable compound and a color image forming substance provided on a support, said silver halide, polymerizable compound and color image forming substance being contained in microcapsules to form light-sensitive microcapsules which are dispersed in the light-sensitive layer, wherein said light-sensitive microcapsules have spectral sensitivity peaks within the wavelength region of 600 nm to 950 nm and comprise at least two kinds of light-sensitive microcapsules differing from each other with respect to spectral sensitivity.

The light-sensitive material of the invention is characterized in that each kind of the light-sensitive microcapsules independently has a peak of the spectral sensitivity within the wavelength region of 600 nm to 950nm (i.e., red and infrared regions) in the spectrum.

The present inventor has noted that a laser beam having a wavelength within the region of 600 nm to 950 nm such as glass laser and a semiconductor laser is more readily available than other laser beams having a wavelength of not longer than 600 nm such as a gas laser and YAG laser, since the device for the former laser is small-sized, powerful and inexpensive, as compared with that for the latter laser.

In the light-sensitive material of the invention, all of the microcapsules are so arranged that the above-mentioned advantageous laser beam is used as a sole light source. Therefore, the light-sensitive material can be readily employable in an image forming process utilizing a laser beam as the light source. Further, the light-sensitive material employing at least two kinds of microcapsules gives an improved clear image because the laser beam used as the light source is highly monochromatic.

Further, a clear and sharp image can be obtained, even if the spectral sensitivity of each kind of the microcapsules does not have a sharp peak in the spectrum, since the laser beam is not only highly monochromatic but also energy-rich. Therefore, the light-sensitive material of the invention can be advantageously used for printing out a large quantity of information.

DETAILED DESCRIPTION OF THE INVENTION

In the light-sensitive material of the invention, at least two kinds of light-sensitive microcapsules differ from each other with respect to spectral sensitivity, and each kind of the light-sensitive microcapsules independently has a peak of spectral sensitivity within the wavelength region of 600 nm to 950 nm in the spectrum.

The difference (i.e., space) between the spectral sensitivity peaks of the two kinds of microcapsules preferably is not less than 40 nm, more preferably not less than 60 nm, particularly in the case that the light-sensitive material is prepared for the formation of a multi-color image.

It is preferred that each kind of the light-sensitive microcapsules independently has a maximum spectral sensitivity peak within the wavelength region of 600 nm to 950 nm. The maximum spectral sensitivity peak of each kind of the light-sensitive microcapsules preferably has a sensitivity strength of not less than five times (more preferably not less than ten times) as much as spectral sensitivity at the same wavelength of the other kinds of microcapsules having different maximum spectral sensitivity peaks.

The light-sensitive material of the invention can contain three or more kinds of light-sensitive microcapsules which differ from each other with respect to the spectral sensitivity. Even in such a case, all of the light-sensitive microcapsules essentially should be defined according to the present invention. In other words, all kinds of the light-sensitive microcapsules have a peak of the spectral sensitivity within the wavelength region of 600 nm to 950 nm in the spectrum.

Where the light-sensitive material contains three kinds of light-sensitive microcapsules differing from each other with respect to the spectral sensitivity, a yellow color image forming substance, a cyan color image forming substance and a magenta color image forming substance can be respectively contained in the three kinds of microcapsules to form a full color image (i.e., multi-color image). The light-sensitive material of the invention can give an improved clear full color image which is reduced in impurity of the color, because the laser beam used as the light source is highly monochromatic and the interaction and transference of components between the neighboring image elements (i.e., light-sensitive microcapsules) are limited by the shell of the microcapsule.

In a conventional system, the spectral sensitivities of the microcapsules are usually arranged within visible region (400 nm to 700 nm; e.g., blue, green and red). In the present invention, the red and infrared region (600 nm to 950 nm) is employed in place of the visible blue region. Therefore, the present invention employs a false color system in place of a natural color system in order to form a full color image. The full color image can be formed according to a known subtractive color process.

Further, when a light-sensitive microcapsule which contains a black color image forming substance is used in addition to the above-mentioned light-sensitive microcapsules, the light-sensitive material can form an image improved within the area which should have a clear black color, such as a character. In the case that a gray color is not balanced in the image formation employing yellow, cyan and magenta color image forming substances, the gray color can be corrected by the introduction of a black color image forming substance composed of two or more substances.

In the case that the polymerizable compound within the area where the latent image has been formed is polymerized, the sensitivity of the light-sensitive microcapsule containing the black color image forming substance is preferably higher than that of other microcapsules. On the other hand, in the case that the polymerizable compound within the area where the latent image has not been formed is polymerized, the sensitivity of the microcapsule containing the black color image forming substance is preferably lower than the sensitivity of other microcapsules.

The light-sensitive material of the invention has various embodiments other than those mentioned above. The light-sensitive material can employ five or more kinds of microcapsules. However, essentially all kinds of the microcapsules containing silver halide, a polymerizable compound and a color image forming substance should be defined according to the present invention.

The spectral sensitivity of the microcapsule mainly depends on that of the silver halide contained in the microcapsule. The spectral sensitivity of the silver halide can be varied and arranged within the range of 600 nm to 900 nm employing a spectral sensitizing dye, a chemical sensitizer, a super sensitizer, a stabilizer or an antifoggant. Among them, the spectral sensitizing dye is most preferably employed. The details of the spectral sensitizing dye are described below.

In the present invention, a red or infrared sensitizing dye is used as the spectral sensitizing dye. The sensitizing dye preferably is a methine dye (e.g., a cyanine dye, a merocyanine dye, a complex cyanine dye, a complex merocyanine dye, a holopolar cyanine dye, a hemicyanine dye, a styryl dye, a hemioxonol dye). The sensitizing dyes can be used singly or in combination. Combinations of sensitizing dyes are often used for the purpose of supersensitization. In addition to the sensitizing dyes, a substance which does not per se exhibit spectral sensitization effect or does not substantially absorb visible light but shows supersensitizing activity (i.e., supersensitizer) can be used. The amount of the sensitizing dye to be added generally ranges from about $10^{-8}$ to about $10^{-2}$ mol per 1 mol of silver halide. The spectral sensitizing dye is preferably adsorbed on the silver halide. Therefore, the dye is preferably added in the course of the preparation of the silver halide emulsion (simultaneously with or after the grain formation).

Examples of a red or infrared sensitizing dye are described below. These red and infrared sensitizing dyes are also described in Japanese Patent Provisional Publication Nos. 60(1985)-196757 and 61(1986)-65232.

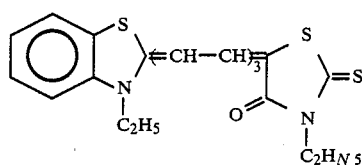

(1)

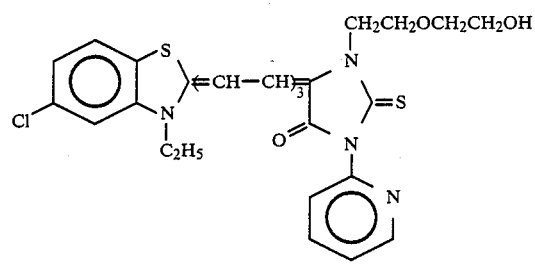

(2)

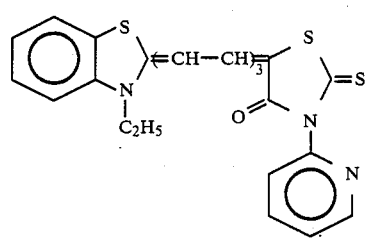

(3)

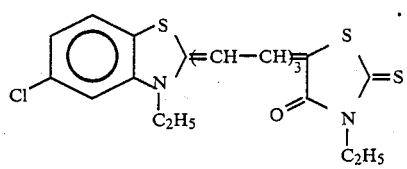

(4)

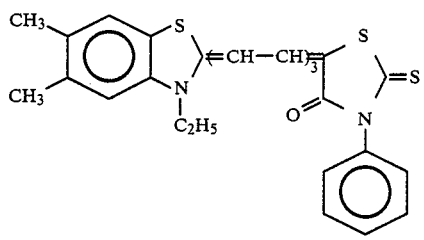

(5)

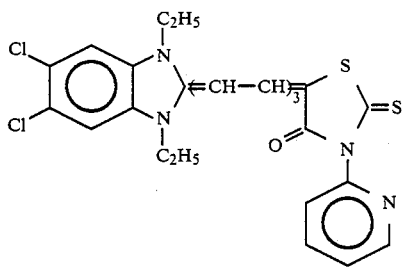

(6)

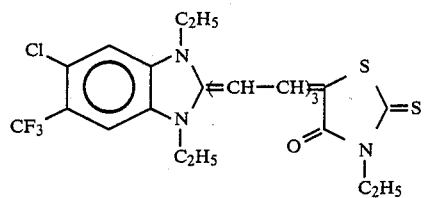
(7)
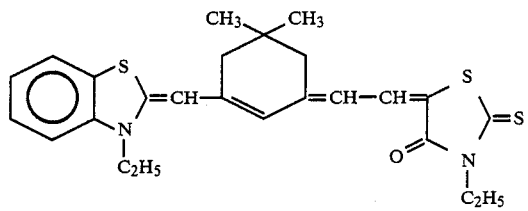
(8)
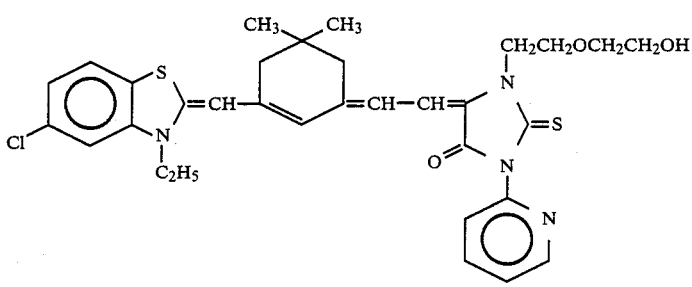
(9)
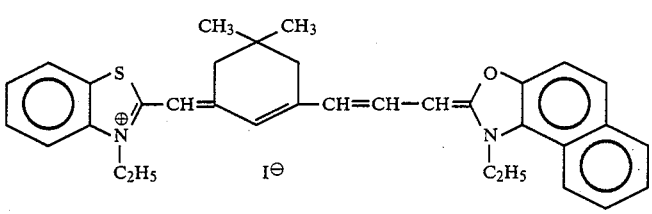
(10)
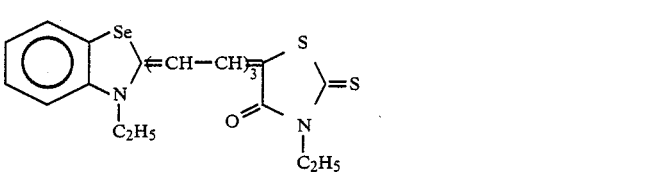
(11)
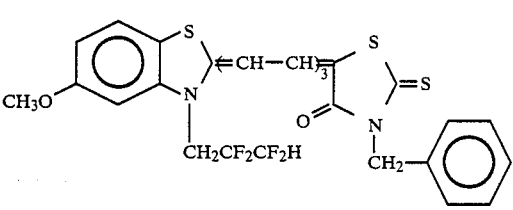
(12)
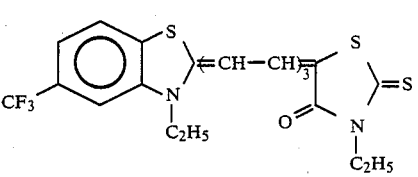
(13)
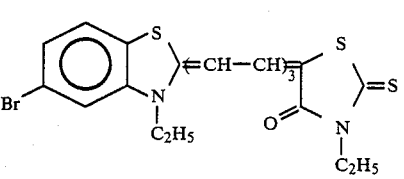
(14)

-continued
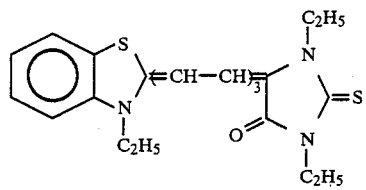 (15)
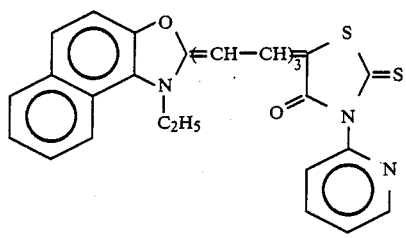 (16)
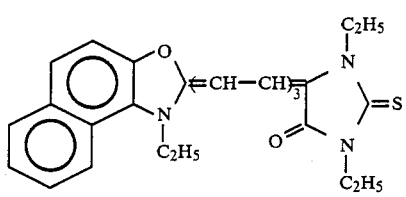 (17)
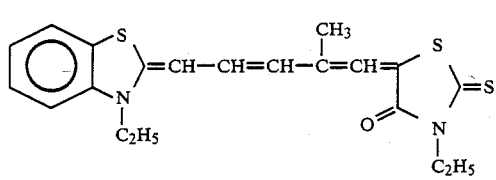 (18)
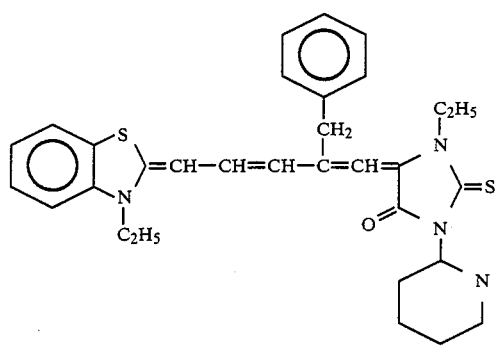 (19)
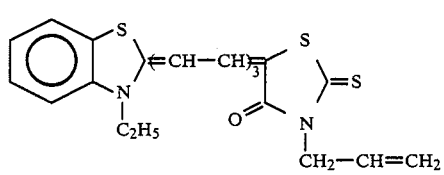 (20)
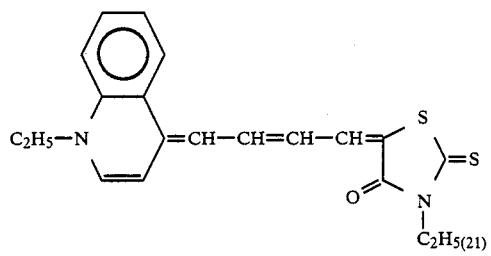 (21)

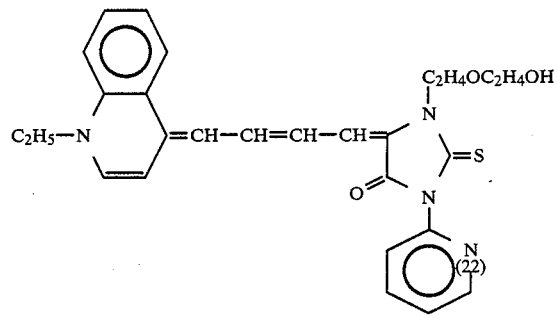
(22)
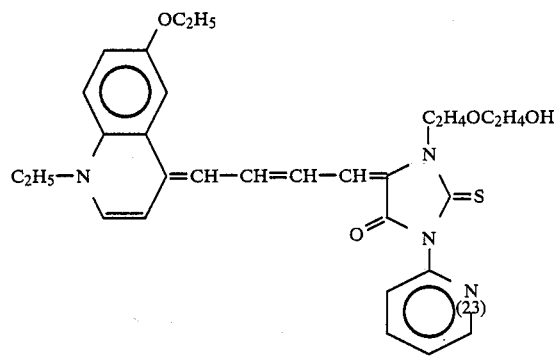
(23)
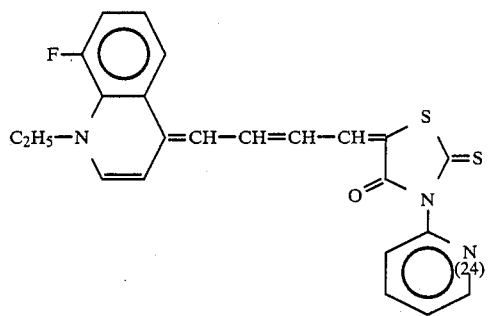
(24)
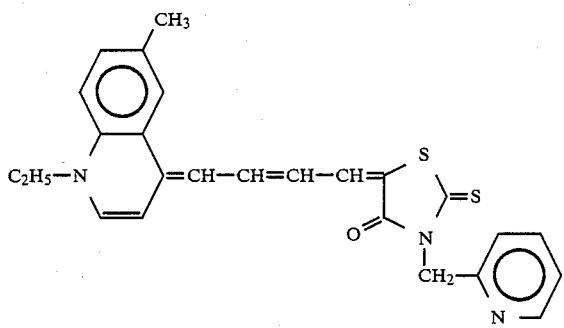
(25)

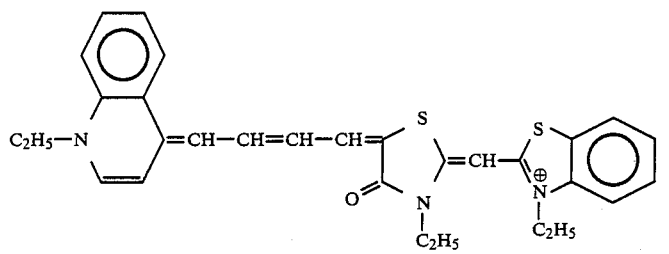
(26)
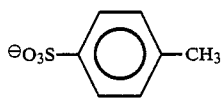
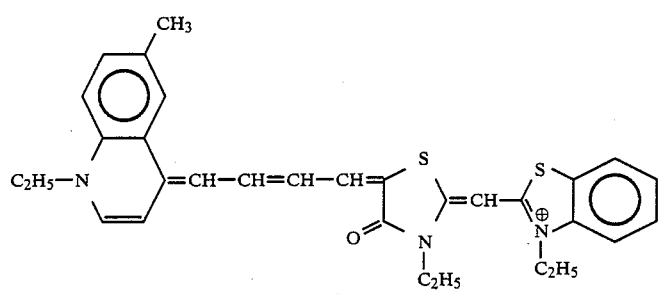
(27)
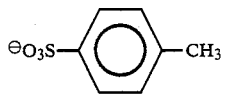
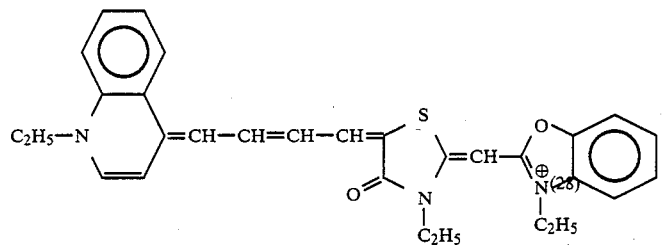
(28)
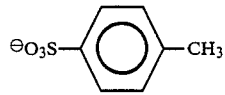
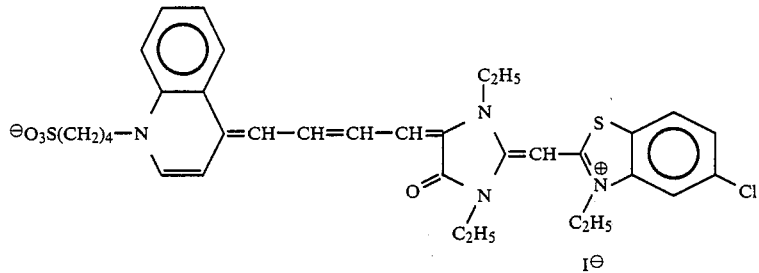
(29)

-continued
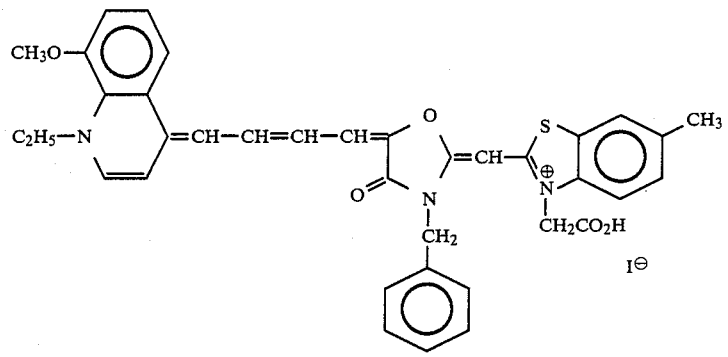
(30)
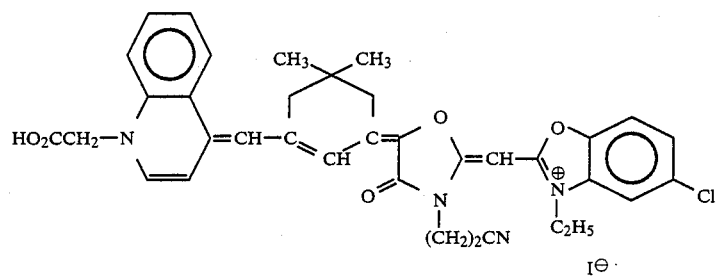
(31)
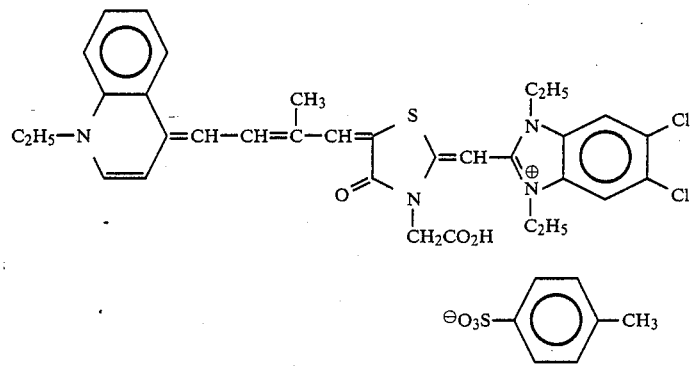
(32)
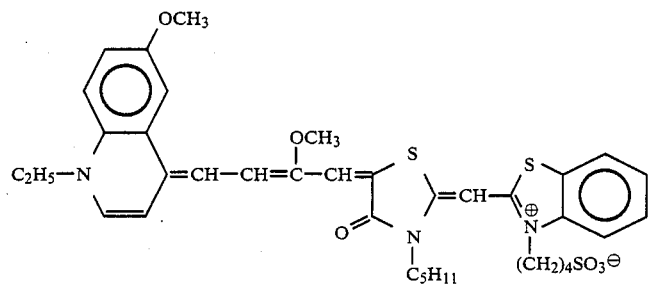
(33)
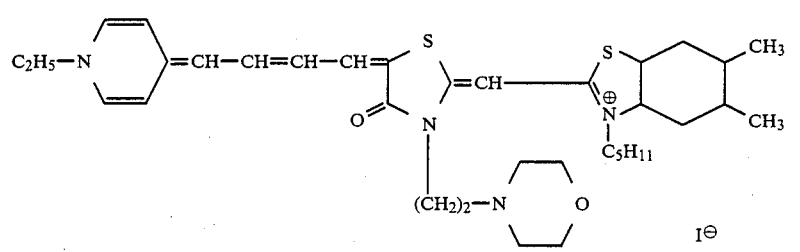
(34)

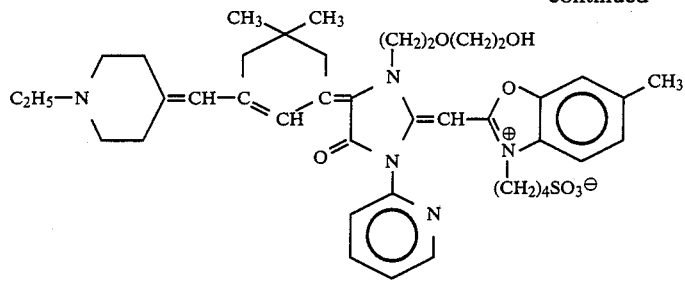

(35)

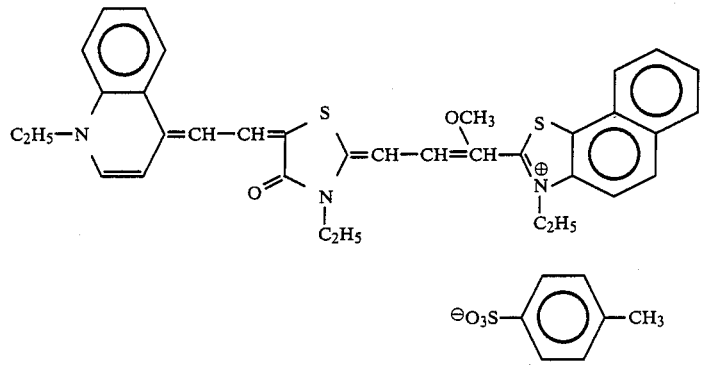

(36)

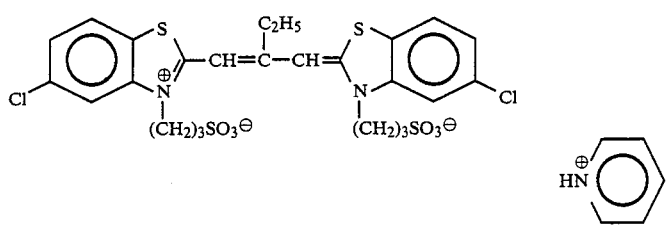

(37)

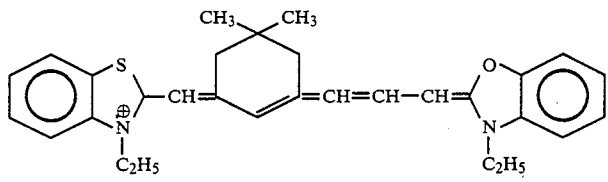

(38)

Examples of a supersensitizer include an aminostyryl compound substituted with a nitrogen-containing heterocyclic group (described in U.S. Pat. Nos. 2,933,390 and 3,635,721), an aromatic organic acid-formaldehyde condensate (described in U.S. Pat. No. 3,743,510), a cadmium sasalt and an azaindene compound. A combination of a spectral sensitizing dye and a supersensitizer is stated in U.S. Pat. Nos. 3,615,613, 3,615,641, 3,617,295 and 3,635,721.

The silver halide, the reducing agent, the polymerizable compound, the color image forming substance, the support and the microcapsule containing the silver halide, the polymerizable compound and the color image forming substance which constitute the light-sensitive material of the invention are described below. Thus composed material is referred hereinafter to as "light-sensitive material".

There is no specific limitation with respect to silver halide contained in the light-sensitive layer of the light-sensitive material. Examples of the silver halides include as silver chloride, silver bromide, silver iodide, silver chlorobromide, silver chloroiodide, silver iodobromide, and silver chloroiodobromide in the form of grains.

The halogen composition of individual grains may be homogeneous or heterogeneous.

The silver halide grains ordinarily have a mean size of 0.001 to 10 $\mu$m, more preferably 0.001 to 5 $\mu$m.

The total silver content (including silver halide and an organic silver salt which is one of optional components) in the light-sensitive layer preferably is in the range of from 0.1 mg/m$^2$ to 10 g/m$^2$. The silver content of the silver halide in the light-sensitive layer preferably is not more than 0.1 g/m$^2$, more preferably in the range of from 1 mg to 90 mg/m$^2$.

Two or more kinds of silver halide grains which differ in halogen composition, crystal habit, grain size, and/or other features from each other can be used in combination.

There is no specific limitation on the crystal habit of silver halide grains. For example, a tubular grain having an aspect ratio of not less than 3 can be used.

There is no specific limitation on grain size distribution of silver halide grains. For example, the silver halide grains having such a grain size distribution that the coefficient of the variation is not more than 20% can be employed.

The reducing agent employed in the light-sensitive material has a function of reducing the silver halide and/or a function of accelerating or restraining a polymerization of the polymerizable compound. Examples of the reducing agents having these functions include various compounds, such as hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones, hydrazines, etc. Depending on the nature or amount of the reducing agent, the polymerizable compound within either the area where a latent image of the silver halide has been formed or the area where a latent image of the silver halide has not been formed can be polymerized. In the developing system in which the polymerizable compound within the area where the latent image has not been formed is polymerized, 1-phenyl-3-pyrazolidone is preferably employed as the reducing agent.

The light-sensitive materials employing the reducing agent having these functions (including compounds referred to as developing agent, hydrazine derivative or precursor of reducing agent) are described in Japanese Patent Provisional Publication Nos. 61(1986)-183640, 61(1986)-188535 and 61(1986)-228441. These reducing agents are also described in T. James, "The Theory of the Photographic Process", 4th edition, pp. 291-334 (1977), Research Disclosure No. 17029, pp. 9-15 (June 1978), and Research Disclosure No. 17643, pp. 22-31 (Dec. 1978). The reducing agents described in the these publications can be employed in the light-sensitive material of the present invention. Thus, "the reducing agent(s)" in the present specification means to include all of the reducing agents described in the above mentioned publications and applications.

These reducing agents can be used singly or in combination. In the case that two or more reducing agents are used in combination, certain interactions between these reducing agents may be expected. One of the interactions is for acceleration of reduction of silver halide (and/or an organic silver salt) through so-called superadditivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Examples of these reducing agents include pentadecylhydroquinone, 5-t-butylcatechol, p-(N,N-diethylamino)-phenol, 1-phenyl-4-methyl-4-hydroxymethyl-3-pyrazolidone, 1-phenyl-4-methyl-4-heptadecylcarbonyloxymethyl-3-pyrazolidone, 2-phenylsulfonylamino-4-hexadecyloxy-5-t-octylphenol, 2-phenylsulfonylamino-4-t-butyl-5-hexadecyloxyphenol, 2-(N-butylcarbamoyl)-4-phenylsulfonylaminonaphtol, 2-(N-methyl-N-octadecylcarbamoyl)-4-sulfonylaminonaphthol, 1-acetyl-2-phenylhydrazine, 1-acetyl-2-(p- or o-aminophenyl)hydrazine, 1-formyl-2-(p- or o-aminophenyl)hydrazine, 1-acetyl-2-(p- or o-methoxyphenyl)-hydrazine, 1-lauroyl-2-(p- or o-aminophenyl)hydrazine, 1-trityl-2-(2,6-dichloro-4-cyanophenyl)hydrazine, 1-trityl-2-phenylhydrazine, 1-phenyl-2-(2,4,6-trichlorophenyl)hydrazine, 1-{2-(2,5-di-tert-pentylphenoxy)-butyloyl}-2-(p- or o-aminophenyl)hydrazine, 1-{2-(2,5-di-t-pentylphenoxy)-butyloyl}-2-(p-or o-aminophenyl)-hydrazine pentadecylfluorocaprylate salt, 3-indazolinone, 1-(3,5-dichlorobenzoyl)-2-phenylhydrazine, 1-trityl-2-[{(2-N-butyl-N-octylsulfamoyl)-4-methanesulfonyl}phenyl]hydrazine, 1-{4-(2,5-di-tert-pentylphenoxy)butyloyl}-2-(p-or o-methoxyphenyl)hydrazine, 1-(methoxycarbonylbenzohydryl)2-phenylhydrazine, 1-formyl-2[4{2-(2,4-di-tert-pentylphenoxy)-butylamide}phenyl]hydrazine, 1-acetyl-2-[4-{2-(2,4-di-tert-pentylphenoxy)butylamido}phenyl]hydrazine, 1-trityl-2-[{2,6-dichloro-4-(N,N-di-2-ethylhexyl)carbamoyl}phenyl]hydrazine, 1-(methoxycarbonylbenzohydryl)-2-(2,4-dichlorophenyl)hydrazine, 1-trityl-2-[{2-(N-ethyl-N-octylsulfamoyl)-4-methanesulfonyl}phenyl]hydrazine, 1-benzoyl-2-tritylhydrazine, 1-(4-butoxybenzoyl)-2-trityl-hydrazine, 1-(2,4-dimethoxybenzoyl)-2-tritylhydrazine, 1-(4-dibutylcarbamoylbenzoyl)-2-tritylhydrazine and 1-(1-naphthoyl)-2-tritylhydrazine.

The amount of the reducing agent in the light-sensitive layer preferably ranges from 0.1 to 1,500 mole % based on the amount of silver (contained in the above-mentioned silver halide and an organic silver salt).

There is no specific limitation with respect to the polymerizable compound, and any known polymerizable compounds including monomers, oligomers and polymers can be contained in the light-sensitive layer. In the case that heat development (i.e., thermal development) is utilized for developing the light-sensitive material, the polymerizable compounds having a relatively higher boiling point (e.g., 80° C or higher) that are hardly evaporated upon heating are preferably employed. In the case that the light-sensitive layer contains a color image forming substance, the polymerizable compounds are preferably cross-linkable compounds having plural polymerizable groups in the molecule, because such cross-linkable compounds favorably serve for fixing the color image forming substance in the course of polymerization hardening of the polymerizable compounds.

The polymerizable compound employable for the light-sensitive material are described in the above-mentioned and later-mentioned publications concerning the light-sensitive material.

Preferred polymerizable compounds employable for the light-sensitive material are compounds which are polymerizable through addition reaction or ring-opening reaction. Preferred examples of the compounds being polymerizable through addition reaction include compounds having an ethylenic unsaturated group. Preferred examples of the compounds being polymerizable through ringopening reaction include the compounds having an epoxy group. Among them, the compounds having an ethylenic unsaturated group are preferred.

Examples of compounds having an ethylenic unsaturated group include acrylic acid, salts of acrylic acid, acrylic esters, acrylamides, methacrylic acid, salts of methacrylic acid, methacrylic esters, methacrylamide, maleic anhydride, maleic esters, itaconic esters, styrene, styrene derivatives, vinyl ethers, vinyl esters, N-vinyl heterocyclic compounds, allyl ethers, allyl esters, and compounds carrying a group or groups corresponding to one or more of these compounds.

Concrete examples of the acrylic esters include n-butyl acrylate, cyclohexyl acrylate, 2-ethylhexyl acrylate, benzyl acrylate, furfuryl acrylate, ethoxyethoxy acrylate, dicyclohexyloxyethyl acrylate, nonylphenyloxyethyl acrylate, hexanediol diacrylate, butanediol diacrylate, neopentylglycol diacrylate, trimethylolpropane triacrylate, pentaerylthritol tetraacrylate, dipentaerythritol pentaacrylate, diacrylate of polyoxyethylenated bisphenol A, polyacrylate of hydroxypolyether, polyester acrylate, and polyurethane acrylate.

Concrete examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate, and dimethacrylate of polyoxyalkylenated bisphenol A.

The polymerizable compounds can be used singly or in combination of two or more compounds. For example, a mixture of two or more polymerizable compounds can be employed. Further, compounds formed by bonding a polymerizable group such as a vinyl group or a vinylidene group to a reducing agent or a color image forming substance are also employed as the polymerizable compounds. The light-sensitive materials employing these compounds which show functions as both the reducing agent and the polymerizable compound, or of the color image forming substance and the polymerizable compound are included in embodiments of the invention.

The amount of the polymerizable compound for incorporation into the light-sensitive layer preferably ranges from 5 to $1.2 \times 10^5$ times (by weight) as much as the amount of silver halide, more preferably from 10 to $1 \times 10^4$ times as much as the silver halide.

There is no specific limitation with respect to the color image forming substance, and various kinds of substances can be employed. Thus, examples of the color image forming substance include both colored substance (i.e., dyes and pigments) and non-colored or almost non-colored substance (i.e., color former or dye- or pigment-precursor) which develops to give a color under application of external energy (e.g., heating, pressing, light irradiation, etc.) or by contact with other components (i.e., developer). The light-sensitive material using the color image forming substance is described in Japanese Patent Provisional Publication No. 61(1986)-73145 (corresponding to U.S. Pat. No. 4,629,676 and European Patent Provisional Publication No. 0174634A2).

Examples of the dyes and pigments (i.e., colored substance) employable in the invention include commercially available ones, as well as various known compounds described in the technical publications, e.g., Yuki Gosei Kagaku Kyokai (ed.), Handbook of Dyes (in Japanese, 1970) and Nippon Ganryo Gijutsu Kyokai (ed.), New Handbook of Pigments (in Japanese, 1977). These dyes and pigments can be used in the form of a solution or dispersion.

Examples of the substances which develop to give a color by certain energy includes thermochromic compounds, piezochromic compounds, photochromic compounds and leuco compounds derived from triarylmethane dyes, quinone dyes, indigoid dyes, azine dyes, etc. These compounds are capable of developing a color by heating, application of pressure, light-irradiation or air-oxidation.

Examples of the substances which develop to give a color in contact with other components include various compounds capable of developing a color through some reaction between two or more components, such as acid-base reaction, oxidation-reduction reaction, coupling reaction, chelating reaction, and the like. Examples of such color formation systems are described in Hiroyuki Moriga, "Introduction of Chemistry of Speciality Paper" (in Japanese, 1975), pp. 29–58 (pressure-sensitive copying paper), pp. 87–95 (azo-graphy), pp. 118–120 (heatsensitive color formation by a chemical change) or in MSS. of the seminer promoted by the Society of Kinki Chemical Industry, "The Newest Chemistry of Coloring Matter—Attractive Application and New Development as a Functional Coloring Matter", pp. 26–32 (June, 19, 1980). Examples of the color formation systems specifically include a color formation system used in pressure-sensitive papers, etc., comprising a color former having a partial structure of lactone, lactam, spiropyran, etc., and an acidic substance (developer), e.g., acid clay, phenol, etc.; a system utilizing azo-coupling reaction between an aromatic a diazonium salt, diazotate or diazosulfonate and naphthol, aniline, active methylene, etc.; a system utilizing a chelating reaction, such as a reaction between hexamethylenetetramine and a ferric ion and gallic acid, or a reaction between a phenolphthalein-complexon and an alkaline earth metal ion; a system utilizing oxidation-reduction reaction, such as a reaction between ferric stearate and pyrogallol, or a reaction between silver behenate and 4-methoxy-1-naphthol, etc.

The color image forming substance in the light-sensitive material is preferably used in an amount of from 0.5 to 50 parts by weight, and more preferably from 2 to 30 parts by weight, per 100 parts by weight of the polymerizable compound. In the case that a developer is used, it it preferably used in an amount of from about 0.3 to about 80 parts by weight per one part by weight of the color former.

The silver halide, the polymerizable compound and the color image forming substance are contained in microcapsules which are dispersed in the light-sensitive layer. The reducing agent and the other optional component can be contained in the microcapsules or arranged outside of the microcapsules in the light-sensitive layer. Generally, the reducing agent is preferably contained in the microcapsule, because the reaction can progress smoothly in such case. The reducing agent is more preferably dispersed or dissolved in the core material of the microcapsules. In the case that a heat development is utilized in the use of the light-sensitive material, there is no problem in arranging the reducing agent outside of the microcapsules, because the reducing agent can permeate the microcapsule to reach the core material.

There is no specific limitation on shell material of the microcapsule, and various known materials such as polymers which are employed in the conventional microcapsules can be employed as the shell material. Examples of the shell material include polyamide resin and/or polyester resin, polyurea resin and/or polyurethane resin, aminoaldehide resin, gelatin, epoxy resin, a complex resin containing polyamide resin and polyurea resin, a complex resin containing polyurethane resin and polyester resin.

The mean size of the microcapsule preferably ranges from 0.5 to 50 $\mu$m, more preferably 1 to 25 $\mu$m, most preferably 3 to 20 $\mu$m. The mean grain size of the silver halide preferably is not more than the 5th part of the mean size of the microcapsules, more preferably is not more than the 10th part. It is observed that when the mean sized of the microcapsules is not less than 5 times as much as the mean grain size of silver halide, even and uniform image can be obtained.

The light-sensitive material can be prepared by arranging a light-sensitive layer containing the above-mentioned components on a support. There is no limitation with respect to the support. In the case that heat development is utilized in the use of the light-sensitive material, material of the support preferably is resistant to heat given in the processing stage. Examples of the material employable for the preparation of the support include glass, paper, fine paper, coat paper, synthetic paper, metals and analogues thereof, polyester, acetyl cellulose, cellulose ester, polyvinyl acetal, polystyrene, polycarbonate, polyethylene terephthalate, and paper laminated with resin or polymer (e.g., polyethylene). In the case that a porous material, such as paper is employed as the support, the porous support preferably has such a surface characteristic that a filtered maximum waviness of not less than 4 μm is observed in not more than 20 positions among 100 positions which are determined at random on a filtered waviness curve obtained according to JIS-B-0610.

The light-sensitive layer can further contain optional components such as organic silver salts, various kinds of image formation accelerators, thermal polymerization inhibitors, thermal polymerization initiators, development stopping agents, fluorescent brightening agents, discoloration inhibitors, matting agents, anti-smudging agents, plasticizers, water releasers, binders, photo polymerization initiators and solvents of the polymerizable compound.

When the heat development is employed in the use of the light-sensitive material, an organic silver salt is preferably contained in the light-sensitive material. It can be assumed that the organic silver salt takes part in a redox reaction using a silver halide latent image as a catalyst when heated to a temperature of 80° C. or higher. In such case, the silver halide and the organic silver salt preferably are located in contact with each other or close together. Examples of organic compounds employable for forming such organic silver salt include aliphatic or aromatic carboxylic acids, thiocarbonyl group-containing compounds having a mercapto group or an α-hydrogen atom, imino group-containing compounds, and the like. Among them, benzotriazoles are most preferable. The organic silver salt is preferably used in an amount of from 0.01 to 10 mole, and preferably from 0.01 to 1 mole, per 1 mole of the light-sensitive silver halide. Instead of the organic silver salt, an organic compound (e.g., benzotriazole) which can form an organic silver salt in combination with an inoganic silver salt can be added to the light-sensitive layer to obtain the same effect.

Various image formation accelerators are employable in the light-sensitive material. The image formation accelerators have a function to accelerate the oxidation-reduction reaction between a silver halide (and/or an organic silver salt) and a reducing agent, a function to accelerate emigration of an image forming substance from a light-sensitive layer to an image-receiving material or an image-receiving layer, or a similar function. The image formation accelerators can be classified into inorganic bases, organic bases, base precursors, oils, surface active agents, compounds functioning as an anti-fogging agent and/or a development accelerator, hot-melt solvents, antioxidants and the like. These groups, however, generally have certain combined functions, i.e., two or more of the above-mentioned effects. Thus, the above classification is for the sake of convenience, and one compound often has a plurality of functions combined.

Various examples of these image formation accelerators are shown below.

Preferred examples of the inorganic bases include hydroxides of alkali metals or alkaline earth metals; secondary or tertiary phosphates, borates, carbonates, quinolinates and metaborates of alkali metals or alkaline earth metals; a combination of zinc hydroxide or zinc oxide and a chelating agent (e.g., sodium picolinate); ammonium hydroxide; hydroxides of quaternary alkylammoniums; and hydroxides of other metals. Preferred examples of the organic bases include aliphatic amines (e.g., trialkylamines, hydroxylamines and aliphatic polyamines); aromatic amines (e.g., N-alkyl-substituted aromatic amines, N-hydroxylalkyl-substituted aromatic amines and bis[p-(dialkylamino)phenyl]-methanes), heterocyclic amines, amidines, cyclic amidines, guanidines, and cyclic guanidines. Of these bases, those having a pKa of 7 or more are preferred.

The base precursors preferably are those capable of releasing bases upon reaction by heating, such as salts between bases and organic acids capable of decarboxylation by heating, compounds capable of releasing amines through intramolecular nucleophilic substitution, Lossen rearrangement, or Beckmann rearrangement, and the like; and those capable of releasing bases by electrolysis. Preferred examples of the base precursors include guanidine trichloroacetate, piperidine trichloroacetate, morpholine trichloroacetate, p-toluidine trichloroacetate, 2-picoline trichloroacetate, guanidine phenylsulfonylacetate, guanidine 4-chlorophenylsulfonylacetate, guanidine 4-methyl-sulfonylphenylsulfonylacetate, and 4-acetylaminomethyl propionate.

These bases or base precursors are preferably used in an amount of not more than 100% by weight, and more preferably from 0.1 to 40% by weight, based on the total solid content of the light-sensitive layer. These bases or base precursors can be used singly or in combination.

In the light-sensitive material, the silver halide, the reducing agent, the polymerizable compound and the color image forming substance are preferably contained in microcapsules and the base or base precursor is preferably arranged outside of the microcapsule in the light-sensitive layer. Further, the base or base precursor can be contained in different microcapsules from those containing the polymerizable compound. The base or base precursor can be contained in the microcapsules under a condition that the base or base precursor is dissolved or dispersed in an aqueous solution of a water retention agent, or under a condition that the base or base precursor is adsorbed on solid particles. Furthermore, the base or base precursor can be contained in a layer different from the light-sensitive layer.

Examples of the oils employed in the invention include high-boiling organic solvents which are used as solvents in emulsifying and dispersing hydrophobic compounds.

Examples of the surface active agents employable in the invention include pyridinium salts, ammonium salts and phosphonium salts as described in Japanese Patent Provisional Publication No. 59(1984)-74547; polyalkylene oxides as described in Japanese Patent Provisional Publication No. 59(1984)-57231.

The compounds functioning as an antifogging agent and/or a development accelerator are used to give a clear image having a high maximum density and a low minimum density (an image having high contrast). Examples of the compounds include a 5- or 6-membered nitrogen containing heterocyclic compound (e.g., a cyclic amide compound), a thiourea derivative, a thioether compound, a polyethylene glycol derivative, a thiol derivative, an acetylene compound and a sulfonamide derivative.

The hot-melt solvents preferably are compounds which may be used as solvent of the reducing agent or those which have high dielectric constant and can accelerate physical development of silver salts. Examples of the hot-melt solvents include polyethylene glycols, derivatives of polyethylene oxides (e.g., oleate ester), beeswax, monostearin and high dielectric constant compounds having $-SO_2-$ and/or $-CO-$ group described in U.S. Pat. No. 3,347,675; polar compounds described in U.S. Pat. No. 3,667,959; and 1,10-decanediol, methyl anisate and biphenyl suberate described in Research Disclosure 26-28 (Dec. 1976). The light-sensitive material employing the hot-melt solvents is described in Japanese patent application No. 60(1985)-227527. The hot-melt solvent is preferably used in an amount of from 0.5 to 50% by weight, and more preferably from 1 to 20% by weight, based on the total solid content of the light-sensitive layer.

The antioxidants can be used to eliminate the influence of the oxygen which has an effect of inhibiting polymerization in the development process. Example of the antioxidants is a compound having two or more mercapto groups.

The thermal polymerization initiators employable in the light-sensitive material preferably are compounds that are decomposed under heating to generate a polymerization initiating species, particularly a radical, and those commonly employed as initiators of radical polymerization. The thermal polymerization initiators are described in "Addition Polymerization and Ring Opening Polymerization", pp. 6-18, edited by the Editorial Committee of High Polymer Experimental Study of the High Polymer Institute, published by Kyoritsu Shuppan (1983). Examples of the thermal polymerization initiators include azo compounds, e.g., azobisisobutyronitrile, 1,1'-azobis-(1-cyclohexanecarbonitrile), dimethyl 2,2'-azobisisobutyrate, 2,2'-azobis(2-methylbutyronitrile), and azobisdimethylvaleronitrile; organic peroxides, e.g., benzoyl peroxide, di-tert-butyl peroxide, dicumyl peroxide, tertbutyl hydroperoxide, and cumene hydroperoxide; inorganic peroxides, e.g., hydrogen peroxide, potassium persulfate, and ammonium persulfate; and sodium p-toluenesulfinate. The thermal polymerization initiators are preferably used in an amount of from 0.1 to 120% by weight, and more preferably from 1 to 10% by weight, based on amount of the polymerizable compound. In a system in which the polymerizable compound within the area where the latent image has not been formed is polymerized, the thermal polymerization initiators are preferably incorporated into the light-sensitive layer. The light-sensitive material employing the thermal polymerization initiators is described in Japanese Patent Provisional Publication No. 61(1986)-260241.

The development stopping agents employable in the light-sensitive material are compounds that neutralize a base or react with a base to reduce the base concentration in the layer to thereby stop development, or compounds that mutually react with silver or a silver salt to suppress development. More specifically, examples of the development stopping agents include acid precursors capable of releasing acids upon heating electrophilic compounds capable of undergoing substitution reaction with a coexisting base upon heating, nitrogen-containing heterocyclic compounds, mercapto compounds, and the like. Examples of the acid precursors include oxide esters described in Japanese Patent Provisional Publication Nos. 60(1985)-108837 and 60(1985)-192939 and compounds which release acids through Lossen rearrangement described in Japanese Patent Provisional Publication No. 60(1985)-230133. Examples of the electrophilic compounds which induce substitution reaction with bases upon heating are described in Japanese Patent Provisional Publication No. 60(1985)-230134.

The antismudging agents employable in the light-sensitive material preferably are particles which are solid at ambient temperatures. Examples of the antismudging agents include starch particles described in U.K. Pat. No. 1,232,347; polymer particles described in U.S. Pat. No. 3,625,736; microcapsule particles containing no color former described in U.K. Pat. No. 1,235,991; and cellulose particles, and inorganic particles, such as particles of talc, kaolin, bentonite, agalmatolite, zinc oxide, titanium dioxide or aluminum oxide described in U.S. Pat. No. 2,711,375. Such particles preferably have a means size of 3 to 50 $\mu$m, more preferably 5 to 40 $\mu$m. The size of said particle is preferably larger than that of the microcapsule.

Binders employable in the light-sensitive material preferably are transparent or semi-transparent hydrophilic binders. Examples of the binders include natural substances, such as gelatin, gelatin derivatives, cellulose derivatives, starch, and gum arabic; and synthetic polymeric substances, such as water-soluble polyvinyl compounds e.g., polyvinyl alcohol, polyvinylpyrrolidone, and acrylamide polymers. In addition to the synthetic polymeric substances, vinyl compounds dispersed in the form of latex, which are particularly effective to increase dimensional stability of photographic materials, can be also used. These binders can be used singly or in combination. The light-sensitive material employing a binder is described in Japanese Patent Provisional Publication No. 61(1986)-69062 (corresponding to U.S. Pat. No. 4,629,676 and European Patent Provisional Publication No. 0174634A2).

A photo polymerization initiator can be contained in the light-sensitive layer to polymerize the unpolymerized polymerizable compound after the image-formation.

In the case that the solvent of the polymerizable compound is used, the solvent is preferably contained in a microcapsule which is different from the microcapsule containing the polymerizable compound.

Examples and usage of the other optional components which can be contained in the light-sensitive layer are also described in the above-mentioned publications and applications concerning the light-sensitive material, and in Research Disclosure Vol. 170, No. 17029, pp. 9-15 (June 1978).

The light-sensitive layer preferably has a pH value of not higher than 7.

Examples of auxiliary layers which are optionally arranged on the light-sensitive material include an image-receiving layer, a heating layer, an antistatic layer, an anticurl layer, a release layer, a cover sheet or a protective layer, a layer containing a base or base precursor and a base barrier layer.

Instead of the use of the image-receiving material, the image-receiving layer can be arranged on the light-sensitive material to produce the desired image on the image-receiving layer of the light-sensitive material. The image-receiving layer of the light-sensitive material can be constructed in the same manner as the layer of the image-receiving material.

The light-sensitive material can be prepared, for instance, by the following process.

The light-sensitive material is usually prepared by dissolving, emulsifying or dispersing each of the components of the light-sensitive layer in an adequate medium to obtain coating solution, and then coating the obtained coating solution on a support.

The coating solution can be prepared by mixing liquid compositions each containing a component of the light-sensitive layer. Liquid composition containing two or more components may be also used in the preparation of the coating solution. Some components of the light-sensitive layer can be directly added to the coating solution or the liquid composition. Further, a secondary composition can be prepared by emulsifying the oily (or aqueous) composition in an aqueous (or oily) medium to obtain the coating solution.

The silver halide is preferably prepared in the form of a silver halide emulsion. Various processes for the preparation of the silver halide emulsion are known in the conventional technology for the preparation of photographic materials.

The silver halide emulsion can be prepared by the acid process, neutral process or ammonia process. In the stage for the preparation, a soluble silver salt and a halogen salt can be reacted in accordance with the single jet process, double jet process or a combination thereof. A reverse mixing method, in which grains are formed in the presence of excess silver ions, or a controlled double jet process, in which a pAg value is maintained constant, can be also employed. In order to accelerate grain growth, the concentrations or amounts or the silver salt and halogen salt to be added or the rate of their addition can be increased as described in Japanese Patent Provisional Publication Nos. 55(1980)-142329 and 55(1980) -158124, and U.S. Pat. No. 3,650,757, etc.

The silver halide emulsion may be of a surface latent image type that forms a latent image predominantly on the surface of silver halide grains, or of an inner latent image type that forms a latent image predominantly in the interior of the grains. A direct reversal emulsion comprising an inner latent image type emulsion and a nucleating agent may be employed. The inner latent image type emulsion suitable for this purpose is described in U.S. Pat. Nos. 2,592,250 and 3,761,276, Japanese Patent Publication No. 58(1983)-3534 and Japanese Patent Provisional Publication No. 57(1982)-136641, etc. The nucleating agent that is preferably used in combination with the inner latent image type emulsion is described in U.S. Pat. Nos. 3,227,552, 4,245,037, 4,255,511, 4,266,013 and 4,276,364, and West German Patent Provisional Publication (OLS) No. 2,635,316.

In the preparation of the silver halide emulsions, hydrophilic colloids are advantageously used as protective colloids. Examples of usable hydrophilic colloids include proteins, e.g., gelatin, gelatin derivatives, gelatin grafted with other polymers, albumin, and casein; cellulose derivatives, e.g., hydroxyethyl cellulose, carboxymethyl cellulose, cellulose sulfate, etc.; saccharide derivatives, e.g., sodium alginate and starch derivatives; and a wide variety of synthetic hydrophilic polymers, such as polyvinyl alcohol, polyvinyl alcohol partial acetal, poly-N-vinylpyrrolidone, polyacrylic acid, polymethacrylic acid, polyacrylamide, polyvinylimidazole, and polyvinylpyrazole, and copolymers comprising monomers constituting these homopolymers. Among them, gelatin is most preferred. Examples of employable gelatins include not only lime-processed gelatin, but also acid-processed gelatin and enzyme-processed gelatin. Hydrolysis products or enzymatic decomposition products of gelatin can also be used.

In the formation of silver halide grains in the silver halide emulsion, ammonia, an organic thioether derivative as described in Japanese Patent Publication No. 47(1972)-11386 or sulfur-containing compound as described in Japanese Patent Provisional Publication No. 53(1978)-144319can be used as a silver halide solvent. Further, in the grain formation or physical ripening, a cadmium salt, a zinc salt, a lead salt, a thallium salt, or the like can be introduced into the reaction system. Furthermore, for the purpose of overcoming high or low intensity reciprocity law failure, a water-soluble iridium salt, e.g., iridium (III) or (IV) chloride, or ammonium hexachloroiridate, or a water-soluble rhodium salt, e.g., rhodium chloride can be used.

After the grain formation or physical ripening, soluble salts may be removed from the resulting emulsion by a known noodle washing method or a sedimentation method. The silver halide emulsion may be used in the primitive condition, but is usually subjected to chemical sensitization. Chemical sensitization can be carried out by the sulfur sensitization, reduction sensitization or noble metal sensitization, or a combination thereof that are known for emulsions for the preparation of the conventional light-sensitive materials.

When a spectral sensitizing dye is added to the silver halide emulsion, the sensitizing dye is preferably added during the preparation of the emulsion. The sensitizing dye is preferably dissolved in an adequate solvent prior to the addition to the silver halide emulsion. Examples of the solvent include a water-miscible organic solvent (e.g., methanol, ethanol, propanol, a fluorinated alcohol methyl cellosolve, dimethylformamide and acetone) and water which may be alkaline or acid. These solvents can be used singly or in combination. Alternatively, the sensitizing dye can be used in the form of a dispersion in a medium of water/gelatin or in the form of a powder prepared by using a surface active agent.

When the organic silver salt are contained in the light-sensitive layer, the emulsion of the organic silver salts can be prepared in the same manner as in the preparation of the silver halide emulsion.

In preparation of the light-sensitive material, the polymerizable compounds are used as the medium for preparation of the liquid composition containing another component of the light-sensitive layer. For example, the silver halide (including the silver halide emulsion), the reducing agent or the color image forming substance can be dissolved, emulsified or dispersed in the polymerizable compound to prepare the light-sensitive material. Especially, the color image forming substance is preferably incorporated in the polymerizable compound. Further, the necessary components for preparation of a microcapsule, such as shell material can be incorporated into the polymerizable compound.

The light-sensitive composition which is the polymerizable compound containing the silver halide can be prepared using the silver halide emulsion. The light-sensitive composition can be also prepared using silver halide powders which can be prepared by lyophilization. These light-sensitive composition can be obtained by stirring the polymerizable compound and the silver halide using a homogenizer, a blender, a mixer or other conventional stirring device.

Polymers having a principal chain consisting essentially of a hydrocarbon chain substituted in part with hydrophilic groups which contain, in their terminal groups, -OH or nitrogen having a lone electron-pair are preferably introduced into the polymerizable compound prior to the preparation of the light-sensitive composition. The polymer has a function of dispersing silver halide or other component in the polymerizable compound very uniformly as well as a function of keeping thus dispered state. Further, the polymer has another function of gathering silver halide along the interface between the polymerizable compound (i.e., light-sensitive composition) and the aqueous medium in preparation of the microcapsule. Therefore, using this polymer, silver halide can be easily introduced into the shell material of the microcapsule.

The light-sensitive composition can be also prepared by dispersing microcapsule containing silver halide emulsion as a core structure in the polymerizable compound instead of employing the above polymer.

The light-sensitive composition is preferably emulsified in an aqueous medium to prepare the coating solution. The necessary components for preparation of the microcapsule, such as shell material can be incorporated into the emulsion. Further, other components such as the reducing agent can be added to the emulsion.

The emulsion of the polymerizable compound can be processed for forming shell of the microcapsule. Examples of the process for the preparation of the microcapsules include a process utilizing coacervation of hydrophilic wall-forming materials (described in U.S. Pat. Nos. 2,800,457 and 2,800,458), an interfacial polymerization process (described in U.S. Pat. No. 3,287,154, U.K. Pat. No. 990,443 and Japanese Patent Publication Nos. 38(1963)-19574, 42(1967)-446 and 42(1967)-771), a process utilizing precipitation of polymers (described in U.S. Pat. Nos. 3,418,250 and 3,660,304), a process of using isocyanate-polyol wall materials (described in U.S. Pat. No. 3,796,669), a process of using isocyanate wall materials (described in U.S. Pat. No. 3,914,511), a process of using ureaformaldehyde or urea-formaldehyde-resorcinol wall-forming materials (described in U.S. Pat. Nos. 4,001,140, 4,087,376 and 4,089,802), a process of using melamineformaldehyde resins hydroxypropyl cellulose or like wall-forming materials (described in U.S. Pat. No. 4,025,455), an in situ process utilizing polymerization of monomers (described in U.K. Pat. No. 867,797 and U.S. Pat. No. 4,001,140), an electrolytic dispersion and cooling process (described in U.K. Pat. Nos. 952,807 and 965,074), a spray-drying process (described in U.S. Pat. No. 3,111,407 and U.K. Pat. No. 930,422), and the like. It is preferable, though not limitative, that the microcapsule is prepared by emulsifying core materials containing the polymerizable compound and forming a polymeric membrane (i.e., shell) over the core materials.

In the above-mentioned process, an aqueous dispersion of the microcapsules can be obtained. The dispersion of the three or more kinds of the microcapsules each of which follows the present invention can be used as the coating solution of the light-sensitive material. The other components can be added to the coating solution in a similar manner as the emulsion of the polymerizable compound.

A light-sensitive material of the invention can be prepared by coating and drying the above-prepared coating solution on a support in the conventional manner.

The use of the light-sensitive material of the invention is described below.

In the use of the light-sensitive material of the invention, a development process is conducted simultaneously with or after an imagewise exposure.

In the present invention, various exposure means having the wavelength within the range of 600 nm to 950 nm can be employed in the image exposure. Among the means, glass layer and a semiconductor laser are preferred. The type of light source and exposure can be selected depending on the light-sensitive wavelengths determined by the spectral sensitivity of silver halide. Original image can be either monochromatic image or color image.

Development of the light-sensitive material can be conducted simultaneously with or after the imagewise exposure. The development can be conducted using a developing solution in the same manner as the image forming method described in Japanese Patent Publication No. 45(1970)-11149. The image forming method described in Japanese Patent Provisional Publication No. 61(1986)-69062which employs a heat development process has an advantage of simple procedures and short processing time because of the dry process. Thus, the latter method is preferred as the development process of the light-sensitive material.

Heating in the heat development process can be conducted in various known manners. The heating layer which is arranged on the light-sensitive material can be used as the heating means in the same manner as the light-sensitive material described in Japanese Patent Provisional Publication No. 61(1986)-294434. Further, the light-sensitive material can be heated while suppressing supply of oxygen into the light-sensitive layer from outside. Heating temperatures for the development process usually ranges from 80° C. to 200° C., and preferably from 100° C. to 160° C. Various heating patterns are applicable. The heating time is usually not shorter than 1 second, preferably from 1 second to 5 minutes, and more preferably from 1 second to 1 minute.

During the above development process, a polymerizable compound within the area where a latent image of the silver halide has been formed or within the area where a latent image of the silver halide has not been formed is polymerized. In a general system, the polymerizable compound within the area where the latent image has been formed is polymerized. If a nature or amount of the reducing agent is controlled, the polymerizable compound within the area where the latent image has not been formed can be polymerized.

A color image can be formed on the light-sensitive material in which the light-sensitive layer contains a color former and a developer as the color image forming substances, one of them is together with the polymerizable compound contained in a microcapsule, and the other is arranged outside of the microcapsule.

The image can be also formed on the image-receiving material. The image-receiving material is described hereinbelow. The image forming method employing the image-receiving material or the image-receiving layer is described in Japanese Patent Provisional Publication No. 61(1986)-278849.

Examples of the material employable as the support of the image-receiving material include baryta paper in addition to various examples which can be employed as the support of the following light-sensitive material. In the case that a porous material, such as paper is used as the support of the image-receiving material, the porous support preferably has such a surface characteristic that a filtered maximum waviness of not less than 4 μm is observed in not more than 20 positions among 100 positions which are determined at random on a filtered waviness curve obtained according to JIS-B-0610. Further, a transparent material can be employed as the support of the image-receiving material to obtain a transparent or a projected image.

The image-receiving material is usually prepared by providing the image-receiving layer on the support. The image-receiving layer can be constructed according to the color formation system. In the case that a dye or pigment is employed as the color image forming substance, the image-receiving material can be composed of a simple support.

For example, when a color formation system using a color former and developer is employed, the developer can be contained in the image-receiving layer. Further, the image-receiving layer can be composed of at least one layer containing a mordant. The mordant can be selected from the compound known in the art of the conventional photography according to the kind of the color image forming substance. If desired, the image-receiving layer can be composed of two or more layers containing two or more mordants different in the mordanting power form each other.

The image-receiving layer preferably contains a polymer as binder. The binder which may be employed in the above-mentioned light-receiving layer is also employable in the image-receiving layer. Further, a polymer having a transmission coefficient of oxygen of not more than $1.0 \times 10^{-11}$ cm$^3$·cm/cm$^2$·sec·cmHg can be used as the binder to protect the color of the image formed on the image-receiving material.

The image-receiving layer can contain a granulated thermoplastic compound to obtain a glossy image. Further, a photo polymerization initiator or a thermal-polymerization initiator can be contained in the image-receiving layer to polymerize the unpolymerized polymerizable compound.

A dye or pigment can be contained in the image-receiving layer for the purpose of entering letters, symbols, frames etc. in the image-receiving layer, or of giving a certain color to the background of the image. Further, the dye or pigment can be also employed for the purpose of making it easy to distinguish the sides of the image-receiving material. There is no specific limitation on the dye and pigment. But in the case that the dye or pigment may disturb the image formed on the image-receiving layer, it is preferred to make the density of the dye or pigment low (e.g., reflection density of not higher than 1), or to employ a dye or pigment having a property of being discolored when it is heated or irradiated with light.

Further, when a white pigment, such as titanium dioxide, barium sulfate etc. is contained in the image-receiving layer, the image-receiving layer can function as a white reflection layer. In this case, the white pigment is used in an amount of from 10 g to 100 g based on 1 g of the thermoplastic material.

The above-mentioned dye and pigment can be either uniformly or partially contained in the image-receiving layer. For example, when the support is composed of transparent material, the white pigment can be partially contained in the image-receiving layer to make a part of a reflection image to be transparent. Thus, information of the image which is unnecessary in the transparent image can be entered in the part of the image-receiving layer containing the white pigment as a reflection image.

The image-receiving layer can be composed of two or more layers according to the above-mentioned functions. The thickness of the image-receiving layer preferably ranges from 1 to 100 μm, more preferably from 1 to 20 μm.

A protective layer can be provided on the surface of the image-receiving layer.

In the development process, the color image forming substance is fixed by polymerization of the polymerizable compound. Then, pressing the light-sensitive material on the image-receiving material to transfer the color image forming substance in unfixed area, a color image can be produced on the image-receiving material. The process for pressing can be carried out in various known manners.

The light-sensitive material can be used for monochromatic or color photography, printing, radiography, diagnosis (e.g., CRT photography of diagnostic device using supersonic wave), copy (e.g., computer-graphic hard copy), etc.

The present invention is further described by the following examples without limiting the invention.

EXAMPLE 1

Preparation of silver halide emulsion

In 1,500 ml of water were dissolved 16 g of gelatin and 0.5 g of sodium chloride, and the resulting gelatin solution was adjusted to a pH of 3.8 using 1N sulfuric acid and kept at 60° C. To the gelatin solution, 300 ml of an aqueous solution containing 71 g of potassium bromide and 300 ml of an aqueous solution containing 0.59 mole of silver nitrate were added simultaneously at the same feed rate over a period of 50 minutes. After 10 minutes, to the mixture, 100 ml of aqueous solution containing 2.9 g of potassium iodide and 100 ml of an aqueous solution containing 0.018 mole of silver nitrate were added simultaneously at the same feed rate over a period of 5 minutes. Thus, a silver iodobromide emulsion having tetradecahedral grains, uniform grain size distribution and a mean grain size of 0.22 μm was obtained.

The emulsion was washed for desalting, and to the emulsion were added 94 ml of 0.5% methanol solution of the following sensitizing dye (1) and 75 ml of 2% aqueous solution of the following supersensitizer to obtain a silver halide emulsion (A-1). The yield of the emulsion was 600 g.

(Sensitizing dye (1))

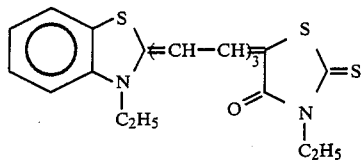

(Supersensitizer)

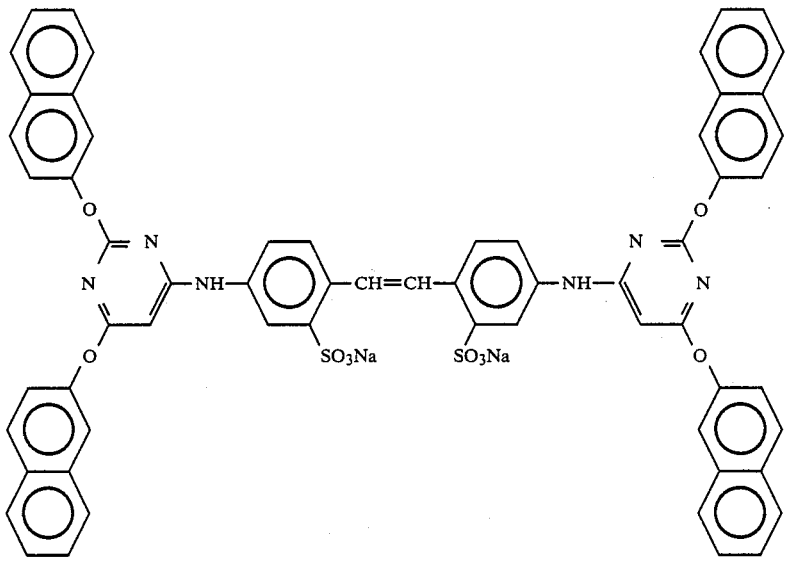

Silver halide emulsions (A-2) to (A-4) were prepared in the same manner as in the preparation of the silver halide emulsion (A-1), except that the following sensitizing dyes (36), (37) and (38) were respectively used in place of the sensitizing dye (1). Each amount of 0.5% methanol solution of the sensitizing dyes is set forth in Table 1.

(Sensitizing dye (36))

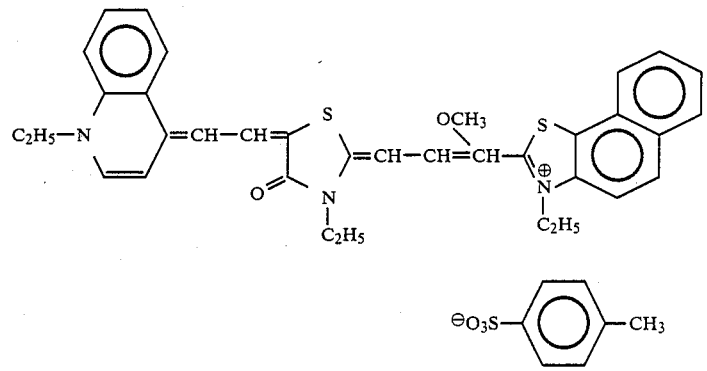

(Sensitizing dye (37))

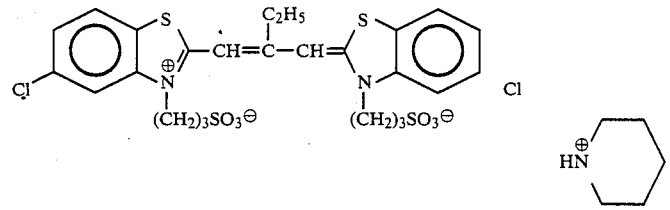

(Sensitizing dye (38))

-continued

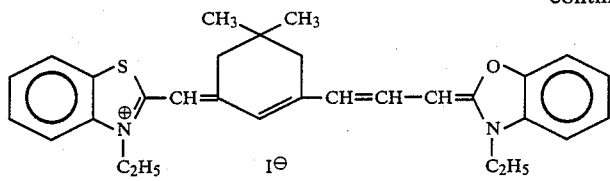

The silver halide emulsions (A-1) to (A-4) are listed in Table 1.

TABLE 1

| Silver Halide Emulsion | Sensitizing Dye | Amount (0.5% Methanol Solution) |
|---|---|---|
| (A-1) | (1) | 94 ml |
| (A-2) | (36) | 145 ml |
| (A-3) | (37) | 67 ml |
| (A-4) | (38) | 85 ml |

Preparation of silver benzotriazole emulsion

In 3,000 ml of water were dissolved 28 g of gelatin and 20 g of benzotriazole, and the solution was kept at 40° C. while stirring. To the solution was added 100 ml of an aqueous solution of 17 g of silver nitrate over 2 minutes. Excessive salts were sedimented and removed from the resulting emulsion by pH-adjustment. Thereafter, the emulsion was adjusted to pH 7.0 to obtain a silver benzotriazole emulsion. The yield of the emulsion was 400 g.

Preparation of light-sensitive composition

In 100 g of trimethylolpropane triacrylate were dissolved 0.1 g of the following copolymer, 13 g of the following (yellow) color image forming substance (a) and 0.5 g of Emulex NP-8 (tradename of Nippon Emulsion Co., Ltd.).

In 18 g of the resulting solution were dissolved 0.3 g of the following reducing agent (I) and 0.8 g of the following reducing agent (II).

Further, to the solution were added 1 g of the silver halide emulsion (A-3), 0.2 g of the silver benzotriazole emulsion and 1 ml of 10% aqueous solution of potassium bromide, and the resulting mixture was stirred at 15,000 r.p.m. for 10 minutes to obtain a light-sensitive composition (Y-1).

(Copolymer)

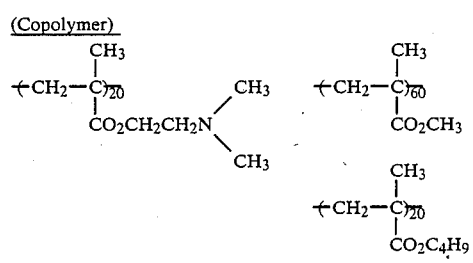

(Color image forming substance (a))

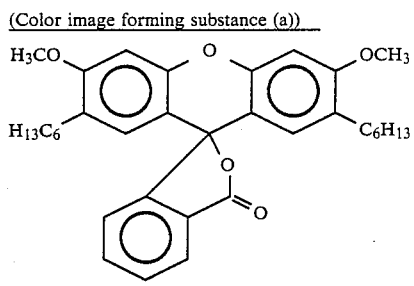

(Reducing agent (I))

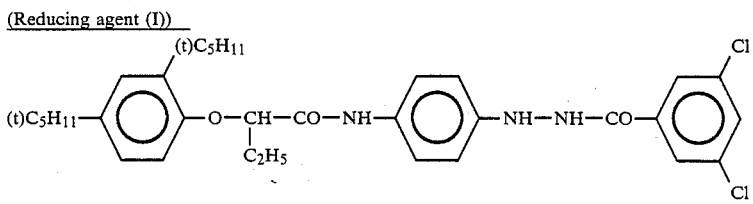

(Reducing agent (II))

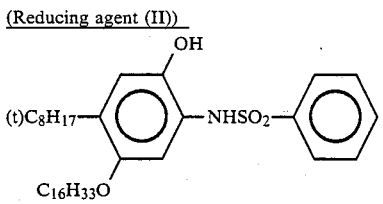

Light-sensitive compositions (Y-2) and (Y-3) were prepared in the same manner as in the preparation of the light-sensitive composition (Y-1), except that the silver halide emulsions (A-2) and (A-1) were respectively used in place of the silver halide emulsion (A-3).

A light-sensitive composition (M-1) was prepared in the same manner as in the preparation of the light-sensitive composition (Y-1), except that 0.85 g of the silver halide emulsion (A-2) was used in place of 1 g of the silver halide emulsion (A-3), and 10 g of the following (magenta) color image forming substance (b) was used in place of 13 g of the (yellow) color image forming substance (a).

(Color image forming substance (b))

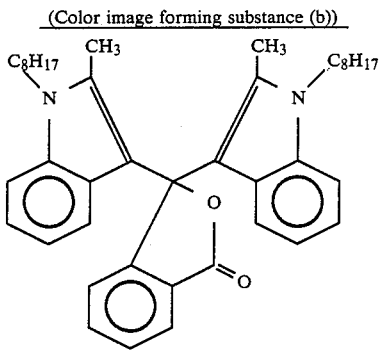

Light-sensitive compositions (M-2) to (M-4) were prepared in the same manner as in the preparation of the light-sensitive composition (M-1), except that the silver halide emulsions (A-4), (A-1) and (A-3) were respectively used in place of the silver halide emulsion (A-2).

A light-sensitive composition (C-1) was prepared in the same manner as in the preparation of the light-sensitive composition (Y-1), except that 0.8 g of the silver halide emulsion (A-1) was used in place of 1 g of the silver halide emulsion (A-3), and 12 g of the following (cyan) color image forming substance (c) was used in place of 13 g of the (yellow) color image forming substance (a).

(Color image forming substance (c))

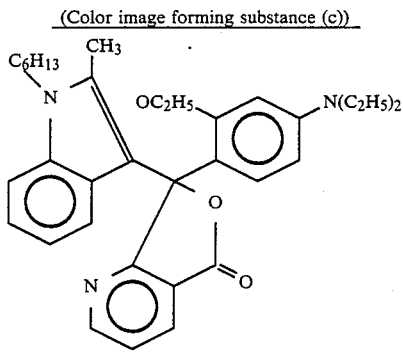

Light-sensitive compositions (C-2) and (C-3) were prepared in the same manner as in the preparation of the light-sensitive composition (C-1), except that the silver halide emulsions (A-3) and (A-2) were respectively used in place of the silver halide emulsion (A-1).

The light-sensitive compositions (Y-1) to (C-3) are listed in Table 2.

TABLE 2

| Light-sensitive Composition | Silver Halide Emulsion | Maximum Peak in Spectrum | Hue of Color Image Forming Substance |
|---|---|---|---|
| (Y-1) | (A-3) | 660 nm | Yellow |
| (Y-2) | (A-2) | 760 nm | Yellow |
| (Y-3) | (A-1) | 810 nm | Yellow |
| (M-1) | (A-2) | 760 nm | Magenta |
| (M-2) | (A-4) | 780 nm | Magenta |
| (M-3) | (A-1) | 810 nm | Magenta |
| (M-4) | (A-3) | 660 nm | Magenta |
| (C-1) | (A-1) | 810 nm | Cyan |
| (C-2) | (A-3) | 660 nm | Cyan |
| (C-3) | (A-2) | 760 nm | Cyan |

Preparation of light-sensitive microcapsule

To 9.0 g of 20% aqueous solution of Isobam (tradename of Kuraray Co., Ltd.) was added 50.0 g of 2.5% aqueous solution of pectin. After the solution was adjusted to a pH of 4.0 using 10% sulfuric acid, the light-sensitive composition (Y-1) was added to the resulting solution, and the mixture was stirred at 7,000 r.p.m. for 5 min. using a homogenizer to emulsify the light-sensitive composition in the aqueous medium.

To 70 g of the aqueous emulsion were added 8.0 g of 40% aqueous solution of urea, 3.0 g of 10% aqueous solution of resorcinol, 8.0 g of 37% aqueous solution of formaldehyde, and 3.0 g of 8% aqueous solution of ammonium sulfate in order, and the mixture was heated at 60° C for 2 hours while stirring. After the mixture was adjusted to a pH of 7.0 using 10.0% aqueous solution of sodium hydroxide, to the mixture was added 4.0 g of 30% aqueous solution of sodium hydrogen sulfite to obtain a light-sensitive microcapsule dispersion (Y-1).

Light-sensitive microcapsule dispersions (Y-2) to (C-3) were prepared in the same manner as in the preparation of the light-sensitive microcapsule dispersion (Y-1), except that the light-sensitive compositions (Y-2) to (C-3) were respectively used in place of the light-sensitive composition (Y-1).

Preparation of light-sensitive material

To the mixture of 3.5 g of the microcapsule dispersion (Y-1), 2.5 g of the microcapsule dispersion (M-1) and 3.0 g of the microcapsule dispersion (C-1) was added 1.0 g of 5% aqueous solution of the following surfactant and 5.0 g of 10% aqueous solution of guanidine trichloroacetate (water/ethanol=80/20 volume ratio) to prepare a coating solution. The coating solution was coated on a cast-coated paper (produced by Sanyo Pulp Co., Ltd.) having a basis weight of 65 g/m² to give a layer having a weight of 35 g/m² and dried at about 40° C. to obtain a light-sensitive material (I).

(Surfactant)

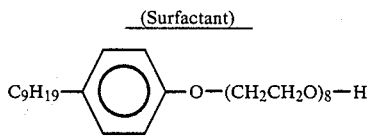

Light-sensitive materials (II) to (VI) were prepared in the same manner as in the preparation of the light-sensitive material (I), except that the light-sensitive microcapsule dispersions were used according to the combinations set forth in Table 3.

TABLE 3

| Light-sensitive Material | Microcapsule Dispersion Kind | Amount | Maximum Peak in Spectrum |
|---|---|---|---|
| (I) | (Y-1) | 3.5 g | 660 nm |
| | (M-1) | 2.5 g | 760 nm |
| | (C-1) | 3.0 g | 810 nm |
| (II) | (Y-1) | 3.5 g | 660 nm |
| | (M-2) | 2.5 g | 780 nm |
| | (C-1) | 3.0 g | 810 nm |
| (III) | (Y-2) | 3.5 g | 760 nm |
| | (M-3) | 2.5 g | 810 nm |
| | (C-2) | 3.0 g | 660 nm |
| (IV) | (Y-3) | 3.5 g | 810 nm |
| | (M-4) | 2.5 g | 660 nm |
| | (C-3) | 3.0 g | 760 nm |

Preparation of image-receiving material

To 125 g of water was added 11 g of 40% aqueous solution of sodium hexametaphosphate, and were further added 34 g of zinc 3,5-di-α-methylbenzylsalicylate and 82 g of 55% slurry of calcium carbonate, followed by coarsely dispersing in a mixer. The coarse dispersion was then finely dispersed in Dynomile dispersing device. To 200 g of the resulting dispersion were added 12 g of 50% latex of SBR (styrene-butadiene rubber) and 77 g of 8% aqueous solution of polyvinyl alcohol, and the resulting mixture was made uniform.

The mixture was then uniformly coated on a cast-coated paper having a basis weight of 65 g/m² to give a layer having a wet thickness of 36 μm and dried to obtain an image-receiving material.

Evaluation of light-sensitive material

Each of the light-sensitive materials (I) to (IV) was exposed to light through various interference filters set forth in Table 4 using a tungsten lamp and then heated on a hot plate at 125° C. for 20 seconds. The exposure was adjusted by the voltage of the tungsten lamp and the exposure time. The combinations of the interference filters are set forth in Table 5.

TABLE 4

| Interference Filter | Peak of Transmitted Light in Spectrum | Half-width |
|---|---|---|
| No. 66 | 660 nm | 10 nm |
| No. 76 | 760 nm | 10 nm |
| No. 78 | 780 nm | 10 nm |
| No. 81 | 810 nm | 10 nm |

TABLE 5

| Light-sensitive Material | Interference Filter Yellow | Magenta | Cyan |
|---|---|---|---|
| (I) | No. 66 | No. 76 | No. 81 |
| (II) | No. 66 | No. 78 | No. 81 |
| (III) | No. 76 | No. 81 | No. 66 |
| (IV) | No. 81 | No. 66 | No. 76 |

Each of the exposed and heated light-sensitive materials was then combined with the image-receiving material and passed through press rolls at pressure of 450 kg/cm² to obtain a positive full color image on the image-receiving material.

As a result, each of the light-sensitive materials (I) to (IV) gave a clear color image, except that minnor impurity of color (magenta and cyan) was observed in the image given by the light-sensitive material (II), in which the difference between the peaks of the two kinds of microcapsules in the spectrum is less than 40 nm.

Further, each of the light-sensitive materials (I) to (IV) was exposed to various laser beams set forth in Table 6 all over the light-sensitive layer through a color separation (yellow, magenta and cyan) positive and then heated on a hot plate at 125° C. for 20 seconds. The laser beams set forth in Table 6 were respectively used in place of the interference filters Nos. 66, 76, 78 and 81.

TABLE 6

| Light Source of Laser Beam | Peak in Spectrum |
|---|---|
| LED (H3000; Stanley Electric Co., Ltd.) | 660 nm |
| LD (LT030MD; Sharp Corporation) | 760 nm |
| LD (HL7801; Hitachi, Ltd.) | 780 nm |
| LD (LT010MC; Sharp Corporation) | 810 nm |

Each of the exposed and heated light-sensitive materials was then combined with the image-receiving material and passed through press rolls at pressure of 450 kg/cm² to obtain a clear positive full color image on the image-receiving material.

Furthermore, each of the light-sensitive materials (I) to (IV) was scanned with laser beams set forth in Table 6 which had converged through a lens changing the intensity and then heated on a hot plate at 125° C. for 20 seconds. Each of the exposed and heated light-sensitive materials was then combined with the image-receiving material and passed through press rolls at pressure of 450 kg/cm² to obtain a clear positive full color image on the image-receiving material. As a result, detailed information was printed out in the image-receiving material.

I claim:

1. A light-sensitive material comprising a light-sensitive layer which contains silver halide, a reducing agent, an ethylenically unsaturated polymerizable compound and a color image forming substance provided on a support, said silver halide, polymerizable compound and color image forming substance being contained in microcapsules to form light-sensitive microcapsules which are dispersed in the light-sensitive layer, wherein each of the light-sensitive microcapsules has the maximum spectral sensitivity peak within the wavelength region of 600 nm to 950 nm and said light-sensitive microcapsules comprise at least two kinds of light-sensitive microcapsules differing from each other with respect to spectral sensitivity, the peaks of said microcapsules being apart from each other by a wavelength of not less than 60 nm.

2. The light-sensitive material as claimed in claim 1, wherein the light-sensitive microcapsules comprise at least three kinds of light-sensitive microcapsules differing from each other with respect to spectral sensitivity.

3. The light-sensitive material as claimed in claim 1, wherein the light-sensitive microcapsules comprise at least three kinds of light-sensitive microcapsules differing from each other with respect to spectral sensitivity, and a yellow color image forming substance, a cyan color image forming substance and a magenta color image forming substance are respectively contained in the three kinds of microcapsules.

4. The light-sensitive material as claimed in claim 1, wherein the reducing agent is contained in the microcapsules.

5. The light-sensitive material as claimed in claim 1, wherein each kind of the microcapsules independently contains a spectral sensitizing dye which is adsorbed on the silver halide.

6. The light-sensitive material as claimed in claim 1, wherein the polymerizable compound is contained in the microcapsules in an amount of 5 to $1.2 \times 10^5$ times by weight as much as the amount of the silver halide.

* * * * *